United States Patent [19]
Yung et al.

[11] Patent Number: 6,153,849
[45] Date of Patent: Nov. 28, 2000

[54] METHOD AND APPARATUS FOR PREVENTING ETCH RATE DROP AFTER MACHINE IDLE IN PLASMA ETCH CHAMBER

[75] Inventors: Ken-Yuan Yung, Taipei; Ming-Shue Yan, Taitugu; Tsar-Yi Chen, Chu-pei; Wen-Bing Lin, Fun-Sun; Chuan-Yi Wang, Yang-Mai, all of Taiwan

[73] Assignee: Taiwan Semiconductor Manufacturing Co., Ltd., Hsin Chu, Taiwan

[21] Appl. No.: 09/240,415

[22] Filed: Jan. 29, 1999

[51] Int. Cl.⁷ ..................................................... B23K 10/00
[52] U.S. Cl. ................................ 219/121.43; 219/121.41; 219/121.42; 156/345; 118/723 I; 315/111.51
[58] Field of Search .......................... 219/121.42, 121.41, 219/121.44, 121.43; 156/345, 643.1, 646.1; 118/723 I, 723 R; 204/298.12, 298.37, 298.38; 315/111.81, 111.51

[56] References Cited

U.S. PATENT DOCUMENTS

| | | | |
|---|---|---|---|
| 5,350,480 | 9/1994 | Gray | 156/345 |
| 5,525,159 | 6/1996 | Hama et al. | 118/723 I |
| 5,690,050 | 11/1997 | Doi | 118/723 I |
| 5,783,102 | 7/1998 | Keller | 438/732 |
| 5,846,331 | 12/1998 | Miyamoto | 118/723 I |
| 6,015,465 | 1/2000 | Kholodenko et al. | 118/723 I |

*Primary Examiner*—Mark Paschall
*Attorney, Agent, or Firm*—Tung & Associates

[57] ABSTRACT

An apparatus and a method for preventing etch rate drop after a machine idle time in a plasma etch chamber are disclosed. In the apparatus, an enclosure for enclosing a top plate in the plasma etch chamber is provided which is equipped with a heater in fluid communication with the enclosure. The top plate which includes a dielectric window and an inductive coil can be heated to a temperature between about 35° C. and about 45° C. during machine idle time to prevent etch rate drop after the chamber is restarted. The plasma etch chamber may be an inductively coupled RF plasma etcher. The heater may be constructed by a heater housing which is in fluid communication with the enclosure, at least one heating lamp in the housing, and a blower for delivering heated air into the enclosure cavity. By utilizing the present invention novel apparatus and method, etch rate can be substantially maintained even after a machine idle time and an under-etch condition can be prevented to substantially eliminate scrap of defective wafers.

25 Claims, 2 Drawing Sheets

METHOD AND APPARATUS FOR PREVENTING ETCH RATE DROP AFTER MACHINE IDLE IN PLASMA ETCH CHAMBER

FIELD OF THE INVENTION

The present invention generally relates to a method and an apparatus for preventing etch rate drop after machine idle in a plasma etch chamber and more particularly, relates to a method and an apparatus for heating a top plate in a plasma etch chamber which includes an induction coil and a dielectric window during machine idle such that the etch rate achieved on the first few wafers processed does not drop.

BACKGROUND OF THE INVENTION

In the fabrication of modern integrated circuit devices, one of the key requirements is the ability to construct plugs or interconnects in reduced dimensions such that they may be used in a multi-level metalization structure. The numerous processing steps involved require the formation of via holes for the plug or interconnect in a dimension of 0.5 $\mu$m or less for use in high-density logic devices. For instance, in forming tungsten plugs by a chemical vapor deposition method, via holes in such small dimensions must be formed by etching through layers of oxide and spin-on-glass materials at a high etch rate. A high-density plasma etching process utilizing a fluorine chemistry is frequently used for the via formation process.

The via hole formation process can be enhanced by improving the etch directionality by a mechanism known as sidewall passivation to improve the anisotropy of the etching process. By utilizing a suitable etchant gas and reactor parameters, an etch-inhibiting film, normally of a polymeric nature, can be formed on vertical sidewalls. The etch-inhibiting film or the polymeric film slows down or completely stops any possible lateral etching of horizontal surfaces in the via hole. For instance, when a fluorine-containing etchant gas such as $CFH_3$ is used, a fluorine-type polymeric film is formed on the sidewalls. Many photoresist materials may also contribute to the formation of a polymeric film on the sidewalls. After the sidewall is coated with a polymeric film, it is protected by the inhibitor film to preserve the line width or via hole diameter control.

In a modern etch chamber, an electrostatic wafer holding device, i.e., an electrostatic chuck or E-chuck, is frequently used in which the chuck electrostatically attracts and holds a wafer that is positioned on top. The E-chuck holding method is highly desirable in the vacuum handling and processing of wafers. In contrast to a conventional method of holding wafers by mechanical clamping means where only slow movement is allowed during wafer handling, an E-chuck device can hold and move wafers with a force equivalent to several tens of Torr pressure.

In an etch chamber equipped with a plasma generating device and an electrostatic chuck for holding a wafer, a shadow ring is utilized as a seal around the peripheral edge of the wafer. The shadow ring, sometimes known as a focus ring, is utilized for achieving a more uniform plasma distribution over the entire surface of the wafer and to help restrict the distribution of the plasma cloud to stay only on the wafer surface area. The uniform distribution function is further enhanced by a RF bias voltage applied on the wafer during a plasma etching process. Another function served by the shadow ring is sealing at the wafer level the upper compartment of the etch chamber which contains the plasma from the lower compartment of the etch chamber which contains various mechanical components for controlling the E-chuck. This is an important function since it prevents the plasma from attacking the hardware components contained in the lower compartment of the etch chamber. In order to survive the high temperature and the hostile environment, the shadow ring is frequently constructed of a ceramic material such as quartz.

A typical inductively coupled plasma etch chamber 10 is shown in FIG. 1. In the etch chamber 10, which is similar to a Lam TCP etcher, the plasma source is a transformer-coupled plasma source which generates a high-density, low-pressure plasma 12 decoupled from the wafer 14. The plasma source allows an independent control of ion flux and ion energy. Plasma 12 is generated by a flat spiral coil 16, i.e., an inductive coil separated from the plasma by a dielectric plate 18, or a dielectric window on top of the reactor chamber 20. The wafer 14 is positioned sufficiently away from the coil 16 so that it is not affected by the electromagnetic field generated by the coil 16. There is very little plasma density loss since plasma 12 is generated only a few mean free paths away from the wafer surface. The Lam TCP plasma etcher enables a high-density plasma and high etch rates to be achieved. In the plasma etcher 10, an inductive supply 22 and a bias supply 24 are used to generate the necessary plasma field. Multi-pole magnets 26 are used for surrounding the plasma 12 generated. A wafer chuck 28 is used to hold the wafer 14 during the etching process. A ground 30 is provided to one end of the inductive coil 16.

In a typical inductively coupled RF plasma etcher 10 shown in FIG. 1, a source frequency of 13.56 MHZ and a substrate bias frequency of 13.56 MHZ are utilized. An ion density of approximately $0.5~2.0 \times 10^{12}$ cm$^3$ (at wafer), an electron temperature of 3.5~6.0 eV and a chamber pressure of 1~25 m Torr are achieved or used.

In the plasma etcher shown in FIG. 1, when the chamber is idled for any extended length of time, i.e., more than half hour, the etch rate in a semiconductor material layer may drop when production is resumed in the chamber. For instance, such drop has been observed in a doped Poly etching process which leads to incomplete etching of a doped poly layer and subsequently, doped poly residue on the surface of a wafer. This type of defect is frequently known in a fab plant as a "first wafer event". The wafers are frequently scrapped due to the defect. A normal practice in the fab plant is to use season wafers in etch chambers during a pre-heating step after the chamber has been idled more than half hour. Even with the use of season wafers, the doped poly residue problem still exists. It is assumed that the "first wafer event" defect is caused by a decrease in the etch rate of the doped poly since the regular recipe is no longer adequate for etching away the doped poly layer. When an oxide layer is subsequently deposited on top of the poly layer, defects occur on the surface of the wafer. Empirically, it has been observed that after an etch chamber has been idled for about half hour, the temperature of the top plate which includes the inductive coil and the dielectric window has dropped to a temperature of approximately 33~34° C. from its operating temperature of 43~44° C. The longer the idle time of the process chamber, the worse is the yield of the wafer.

It was also observed that after a few wafers have been etched in the plasma etch chamber, the inductive coil generates enough heat to heat up the dielectric window, i.e., the quartz disc, to a temperature of approximately 43~44° C. which is suitable for the doped poly etching process. A suitable process condition is therefore achieved for the etch chamber to function properly even though the first few production or season wafers are wasted. A cause for the rapid cooling of the etch chamber during idle is that an exhaust from the chamber continues through the idle period which takes heat away from the chamber components.

It is therefore an object of the present invention to provide an apparatus for preventing etch rate drop after machine idle in a plasma etch chamber that does not have the drawbacks or shortcomings of the conventional apparatus.

It is another object of the present invention to provide an apparatus for preventing etch rate drop after machine idle in a plasma etch chamber by utilizing a heating means for heating a top plate in the etch chamber that includes a conductive coil and a dielectric window.

It is a further object of the present invention to provide an apparatus for preventing etch rate drop after machine idle in a plasma etch chamber by providing an enclosure for enclosing a top plate in the plasma chamber and a heating means for heating air in the enclosure such that the top plate in the etch chamber is maintained at a temperature of approximately 40° C.

It is another further object of the present invention to provide an apparatus for preventing etch rate drop after machine idle in a plasma etch chamber which includes an enclosure for enclosing a top plate in the etch chamber, a heater housing, at least one heat lamp positioned in the heater housing, and a blower for delivering heated air into the enclosure cavity.

It is yet another object of the present invention to provide a plasma etch chamber that is equipped with an apparatus for preventing etch rate drop after machine idle that includes an etch chamber and an enclosure positioned on top of the etch chamber for enclosing and heating a top plate of the chamber and maintaining the etch rate carried out in the chamber.

It is still another further object of the present invention to provide a method for preventing etch rate drop after machine idle time in a plasma etch chamber by providing an etch chamber equipped with an enclosure for enclosing a top plate of the chamber and for heating the top plate by a heating device.

It is yet another further object of the present invention to provide a method for preventing etch rate drop after machine idle time in a plasma etch chamber by providing a heating means for a top plate of the chamber capable of generating a heated air at a temperature sufficient to maintain the top plate at between about 35° C. and about 45° C. when the heated air is flown to the top plate.

SUMMARY OF THE INVENTION

In accordance with the present invention, a method and an apparatus for preventing etch rate drop after a machine idle time in a plasma etch chamber are provided.

In a preferred embodiment, an apparatus for preventing etch rate drop after machine idle in a plasma etch chamber can be provided which includes an enclosure for enclosing a top plate in the plasma etch chamber forming a cavity therein, the top plate consists of a dielectric window and an inductive coil positioned on the window, and a heating means in fluid communication with the cavity in the enclosure for generating heated air sufficient to maintain the top plate at a temperature of between about 35° C. and about 45° C.

In the apparatus for preventing etch rate drop after machine idle in a plasma etch chamber, the plasma etch chamber may be an inductively coupled RF plasma etcher. The dielectric window may be a quartz disc. The heating means may further include a heater housing, at least one heat lamp positioned in the heater housing and a blower for delivering heated air into the enclosure cavity. The apparatus may further include a temperature sensor positioned in the enclosure cavity for detecting a temperature in the cavity. The apparatus may further include an exhaust port in the enclosure for exhausting heated air from the enclosure cavity. The apparatus may further include a temperature sensor and a process controller for controlling the heat generated by the heating means. The heating means generates a heated air at a temperature of at least 45° C.

In an alternate embodiment, a plasma etch chamber which is equipped with an apparatus for preventing etch rate drop after machine idle is provided which includes an etch chamber which has a first cavity defined by a top plate, a side wall and a bottom plate for carrying out a plasma etching process therein, an enclosure positioned generally on top of the etch chamber which has a second cavity for enclosing the top plate therein, the top plate includes a dielectric window and an induction coil positioned on the window, and a heating means in fluid communication with the second cavity in the enclosure for generating heated air sufficient to maintain the top plate at a temperature of between about 35° C. and about 45° C.

In the plasma etch chamber that is equipped with an apparatus for preventing etch rate drop after machine idle, the heated air generated by the heating means has a temperature of at least 45° C., and preferably at least 50° C. The plasma etch chamber may be an inductively coupled RF plasma etcher. The dielectric window may be a quartz disc. The heating means may include a housing, at least one heat lamp and a blower. The chamber may further include a temperature sensor for detecting a temperature in the cavity, an exhaust port in the enclosure for exhausting heated air from the enclosure cavity, or a temperature and a process controller for controlling the heat generated by the heating means.

The present invention is further directed to a method for preventing etch rate drop after a machine idle in a plasma etch chamber which can be carried out by the operating steps of first providing an etch chamber that has a first cavity defined by a top plate, a sidewall and a bottom plate for carrying out a plasma etching process therein, an enclosure positioned generally on top of the etch chamber which has a second cavity for enclosing the top plate therein, the top plate includes a dielectric window and an induction coil positioned on the window, providing a heating means in fluid communication with the second cavity in the enclosure, and generating a heated air which has a temperature sufficient to maintain the top plate at a temperature between about 35° C. and about 45° C. when the heated air is flown into the second cavity.

The method for preventing etch rate drop after machine idle in a plasma etch chamber may further include the step of providing a plasma etch chamber of an inductively coupled RF plasma etcher. The method may further include the step of providing the dielectric window in a quartz disc. The method may further include the steps of providing a heater housing, positioning and turning on at least one heat lamp in the heater housing, and flowing a heated air into the second cavity in the enclosure. The method may further include the step of positioning a temperature sensor in the second cavity for detecting a temperature in the second cavity, or the step of exhausting partially the heated air from the second cavity through an exhaust port. The method may further include the step of operating a process controller for controlling the heat generated by the heating means, the step of generating a heated air that has a temperature of at least 45° C., or the step of maintaining a temperature of the top plate at about 40° C.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for preventing etch rate drop after a machine idle time in a plasma etch chamber. The apparatus may be provided which includes an enclosure for enclosing a top plate in the plasma chamber and forming a cavity in the enclosure. The top plate may include a dielectric window, or a quartz disc and an induction coil that normally positioned on the window. A heating means is provided in fluid communication with the cavity in the enclosure for generating heated air sufficient to maintain the top plate at a temperature between about 35° C. and about 45° C.

The invention is further directed to a plasma etch chamber which is equipped with an apparatus for preventing etch rate drop after a machine idle time by utilizing an enclosure positioned on top of an etch chamber which has a cavity for enclosing a top plate of the chamber. A heating means is employed to heat the top plate of the chamber to a temperature between about 35° C. and about 45° C. during the machine idle such that when etching process is restarted in the chamber, the etch rate does not drop due to a cold top plate.

The present invention is further directed to a method for preventing etch rate drop after a machine idle time in a plasma etch chamber by utilizing a heating means for heating a top plate of the plasma etch chamber during machine idle to a temperature of about 40° C. with a hot air supplied by a heating means positioned in fluid communication with a cavity in an enclosure that houses the top plate.

It has been found that during a machine idle time of any extended period, i.e., longer than half hour, the top plate in a plasma etch chamber is not adequately heated such that its temperature may drop to about 33~34° C. The other wall components in the plasma etch chamber, i.e., the chamber sidewall and the bottom wall are heated by heating means provided in the chamber to approximately 50° C. in the chamber sidewall, and to approximately 65° C. in the bottom wall and the electrostatic chuck. The present invention novel apparatus therefore provides a unique enclosure on top of the process chamber to enclose the top plate which includes a dielectric window and an inductive coil. A heating means is further provided in fluid communication with a cavity of the enclosure such that heated air is flown into the cavity to maintain the top plate at a temperature of between about 35° C. and 45° C., and preferably at about 40° C. A suitable temperature of the heated air is about 50° C. such that the cavity and the top plate may be heated to about 40° C. After the etching process has been carried out for a few wafers, the etch chamber heats up by the induction coil which in turn heats up the quartz disc to about 43~44° C. The heating means of the present invention novel apparatus can then be turned off and not turned on until the etch chamber is idled again.

Figure 1:
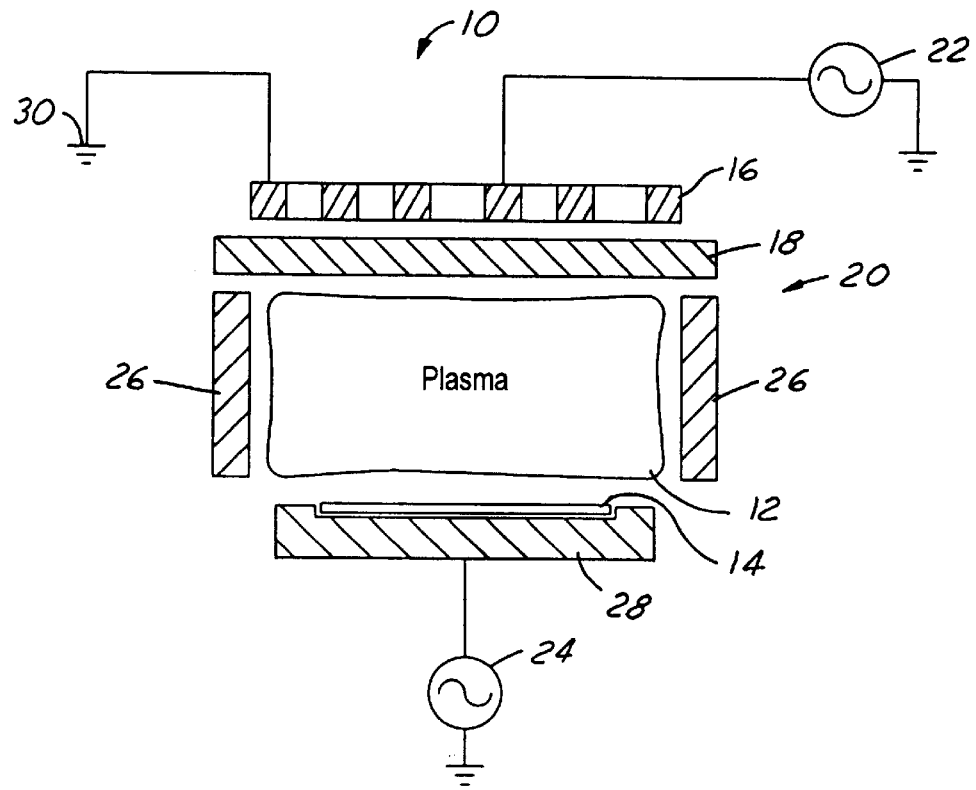
FIG. 1 is a schematic showing a conventional inductively coupled RF plasma etcher.
Figure 2:
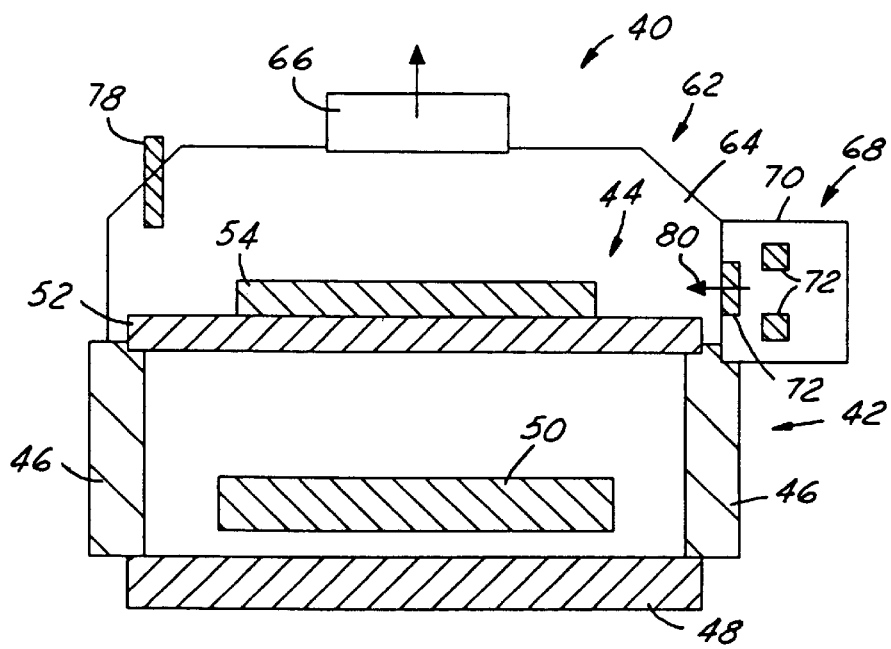
FIG. 2 is a schematic showing a present invention plasma etch chamber incorporating a heating means for heating the top plate.

The present invention novel apparatus 40 is shown in FIG. 2. In apparatus 40, a main etch chamber 42, or a first cavity, is formed by a top plate 44, a chamber sidewall 46 and a bottom wall 48 with an electrostatic chuck 50 positioned thereon. The top plate 44 consists of a dielectric window 52 and an inductive coil 54 similar to that shown in FIG. 1. In the specific construction shown in FIG. 2, such as that normally seen in a Lam TCP 9400 series plasma etcher, the top plate 44 is not heated in contrast to the chamber wall 46 and the bottom wall 48 which are both heated to a controlled temperature. For instance, the chamber wall 46 is normally heated to about 50° C., while the bottom wall is normally heated to about 65° C. The electrostatic chuck 50 is also heated to about 65° C.

The present invention novel apparatus is significantly improved from that of the prior art shown in FIG. 1 by the addition of an enclosure 62, or a second cavity that is built on top of the first enclosure 42. The second enclosure 62 is built to completely enclose the top plate 44 such that its temperature can be suitably controlled. A second cavity 64 is formed inside the enclosure 62 with an exhaust port 66 on top. The enclosure 62 further includes a heating means 68 which consists of a heater housing 70, at least one heat lamp 72 and a blower 74 used to deliver heated air into the second cavity 64. Inside the enclosure 62, a temperature sensor 78 may be provided for detecting a temperature in the cavity 64. A process controller (not shown) may be provided for reading the temperature from sensor 78 and controlling the heat output of the heating lamp 72 thus maintaining a substantially constant temperature inside the second cavity 64. It should be noted that FIG. 2 is presented in a simplified form to illustrate the key components of the present invention novel apparatus and therefore detailed components are not shown.

As shown in FIG. 2, heated air 80 enters into the second cavity 64 to heat the top plate 44 and thus maintaining the dielectric window 52, or the quartz disc at a substantially constant temperature of about 40° C. By suitably controlling the heat output from the heating lamps 72, the temperature of the heated air 80 can be controlled at approximately 50° C. such that temperature of the quartz disc 52 can be controlled within a suitable range, i.e., between about 35° C. and about 45° C. After the process chamber has been operated for a sufficient length of time, the inductive coil 54 heats up and maintains the temperature of the quartz disc 52 such that the heating means 68 may be turned off. The heating means 68 may again be turned on, either manually or automatically by a process controller, when the machine is idled for maintaining the temperature of the quartz disc 52 at a suitable temperature.

Figure 3:
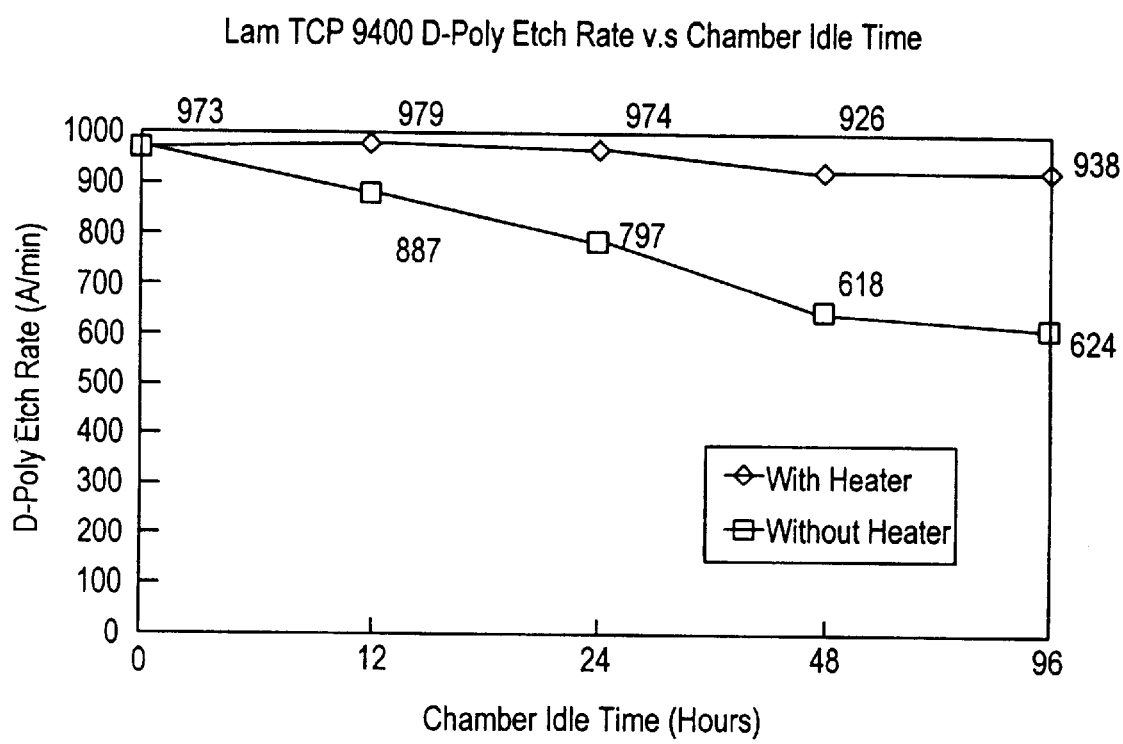
FIG. 3 is a graph illustrating the effectiveness of the present invention apparatus for preventing etch rate drop after a machine idle wherein etch rates are plotted against the chamber idle time.

The effectiveness of the present invention novel apparatus is illustrated in FIG. 3 wherein the etch rates of a doped poly layer are plotted against chamber idle times in a Lam TCP plasma etch chamber. It is seen that, in the top curve representing data obtained in the present invention novel apparatus equipped with the top plate heater, the etch rate remains substantially constant with only a small drop at idle times of larger than 24 hours. The drop at over 24 hours is still within the process spec of 1200±300 Å. This is compared, in contrast, to the lower curve obtained in a conventional apparatus without the top plate heating means. It is seen that even at idle time of more than 1 or 2 hours, the etch rate has sufficiently dropped out of the process specification.

The present invention novel apparatus and method have therefore been amply demonstrated in the above descriptions and in the appended drawings of FIGS. 2 and 3. While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

1. An apparatus for preventing etch rate drop after machine idle in a plasma etch chamber comprising:
    an enclosure enclosing a top plate on the plasma etch chamber forming a cavity therein, said top plate comprising a dielectric window and an induction coil positioned on said window, and
    a heating means in fluid communication with said cavity in the enclosure for generating heated air sufficient to maintain said top plate at a temperature between about 35° C. and about 45° C.

2. An apparatus for preventing etch rate drop after machine idle in a plasma etch chamber according to claim 1, wherein said plasma etch chamber is an inductively coupled RF plasma etcher.

3. An apparatus for preventing etch rate drop after machine idle in a plasma etch chamber according to claim 1, wherein said dielectric window is a quartz disc.

4. An apparatus for preventing etch rate drop after machine idle in a plasma etch chamber according to claim 1, wherein said heating mean further comprises:
    a heater housing,
    at last one heat lamp positioned in said heater housing, and
    a blower for delivering heated air into said enclosure cavity.

5. An apparatus for preventing etch rate drop after machine idle in a plasma etch chamber according to claim 1 further comprising a temperature sensor positioned in said enclosure cavity for detecting a temperature in said cavity.

6. An apparatus for preventing etch rate drop after machine idle in a plasma etch chamber according to claim 1 further comprising an exhaust port in said enclosure for exhausting heated air from said enclosure cavity.

7. An apparatus for preventing etch rate drop after machine idle in a plasma etch chamber according to claim 1 further comprising a temperature sensor and a process controller for controlling heat generated by said heating means.

8. An apparatus for preventing etch rate drop after machine idle in a plasma etch chamber according to claim 1, wherein said heating means generates heated air at a temperature of at least 45° C.

9. A plasma etch chamber equipped with an apparatus for preventing etch rate drop after machine idle comprising:
    an etch chamber having a fist cavity defined by a top plate, a sidewall and a bottom plate for carrying out a plasma etching process therein,
    an enclosure positioned generally on top of said etch chamber having a second cavity for enclosing said top plate therein, said top plate comprises a dielectric window and an induction coil positioned on said window, and
    a heating means in fluid communication with said second cavity in the enclosure for generating heated air sufficient to maintain the top plate at a temperature between about 35° C. and about 45° C.

10. A plasma etch chamber equipped with an apparatus for preventing etch rate drop after machine idle according to claim 9, wherein said heated air generated by said heating means has a temperature of at least 45° C., and preferable at least 50° C.

11. A plasma etch chamber equipped with an apparatus for preventing etch rate drop after machine idle according to claim 9, wherein said plasma etch chamber is an inductively coupled RF plasma etcher.

12. A plasma etch chamber equipped with an apparatus for preventing etch rate drop after machine idle according to claim 9, wherein said dielectric window is a quartz disc.

13. A plasma etch chamber equipped with an apparatus for preventing etch rate drop after machine idle according to claim 9, wherein said heating mean further comprises:
    a heater housing,
    at last one heat lamp positioned in said heater housing, and
    a blower for delivering heated air into said enclosure cavity.

14. A plasma etch chamber equipped with an apparatus for preventing etch rate drop after machine idle according to claim 9 further comprising a temperature sensor positioned in said enclosure cavity for detecting a temperature in said cavity.

15. A plasma etch chamber equipped with an apparatus for preventing etch rate drop after machine idle according to claim 9 further comprising an exhaust port in said enclosure for exhausting heated air from said enclosure cavity.

16. A plasma etch chamber equipped with an apparatus for preventing etch rate drop after machine idle according to claim 9 further comprising a temperature sensor and a process controller for controlling the heat generated by said heating means.

17. A method for preventing etch rate drop after machine idle in a plasma etch chamber comprising the steps of:
    providing an etch chamber having a first cavity defined by a top plate, a sidewall and a bottom plate for carrying out a plasma etching process therein,
    positioning an enclosure having a second cavity on top of said etch chamber enclosing said top plate therein, said top plate comprises a dielectric window and an induction coil positioned on said window,
    providing a heating means in fluid communication with the second cavity in the enclosure, and
    generating a heated air having a temperature sufficient to maintain said top plate at a temperature between about 35° C. and about 45° C. when the heated air is flown into said second cavity.

18. A method for preventing etch rate drop after machine idle in a plasma etch chamber according to claim 17 further comprising the step of providing a plasma etch chamber of an inductively coupled RF plasma etcher.

19. A method for preventing etch rate drop after machine idle in a plasma etch chamber according to claim 17 further comprising the step of providing said dielectric window in a quartz disc.

20. A method for preventing etch rate drop after machine idle in a plasma etch chamber according to claim 17 further comprising the steps of:

providing a heater housing, positioning and turning on at least one heating lamp in said heater housing, and flowing a heated air into said second cavity in said enclosure.

21. A method for preventing etch rate drop after machine idle in a plasma etch chamber according to claim 17 further comprising the step of positioning a temperature sensor in said second cavity for detecting a temperature in said second cavity.

22. A method for preventing etch rate drop after machine idle in a plasma etch chamber according to claim 17 further comprising the step of exhausting partially the heated air from said second cavity through an exhaust port.

23. A method for preventing etch rate drop after machine idle in a plasma etch chamber according to claim 17 further comprising the step of operating a process controller for controlling the heat generated by said heating means.

24. A method for preventing etch rate drop after machine idle in a plasma etch chamber according to claim 17 further comprising the step of generating a heated air having a temperature of at least 45° C.

25. A method for preventing etch rate drop after machine idle in a plasma etch chamber according to claim 17 further comprising the step of maintaining a temperature of said top plate at about 40° C.

* * * * *